US011950695B2

(12) United States Patent
Chen et al.

(10) Patent No.: US 11,950,695 B2
(45) Date of Patent: Apr. 9, 2024

(54) SLIDE RAIL MECHANISM AND SLIDE RAIL KIT THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 18/303,045

(22) Filed: Apr. 19, 2023

(65) Prior Publication Data

US 2023/0248144 A1 Aug. 10, 2023

Related U.S. Application Data

(62) Division of application No. 17/335,313, filed on Jun. 1, 2021, now Pat. No. 11,690,451.

(30) Foreign Application Priority Data

Mar. 10, 2021 (TW) ................................. 110108830

(51) Int. Cl.
*A47B 88/43* (2017.01)

(52) U.S. Cl.
CPC .................................... *A47B 88/43* (2017.01)

(58) Field of Classification Search
CPC ............................. A47B 88/43; H05K 7/1489
USPC .............................................. 312/333; 211/26
See application file for complete search history.

(56) References Cited

U.S. PATENT DOCUMENTS

| | | | |
|---|---|---|---|
| 6,220,456 B1 | 4/2001 | Jensen et al. | |
| 6,644,481 B2 | 11/2003 | Dean et al. | |
| 6,685,033 B1 | 2/2004 | Baddour et al. | |
| 7,275,646 B2 | 10/2007 | Mimlitch, III et al. | |
| 8,083,298 B2 * | 12/2011 | Henderson | H05K 7/1489 312/334.4 |
| 8,127,940 B2 * | 3/2012 | Henderson | H05K 7/1489 312/334.5 |
| 8,240,790 B2 | 8/2012 | Zhang et al. | |
| 9,328,769 B1 | 5/2016 | Chen et al. | |
| 10,729,032 B1 | 7/2020 | Chen et al. | |
| 10,871,186 B1 | 12/2020 | Chen et al. | |
| 2005/0088069 A1 * | 4/2005 | Greenwald | A47B 88/49 312/333 |
| 2009/0101603 A1 | 4/2009 | Hilburn et al. | |
| 2011/0129171 A1 | 6/2011 | Liang et al. | |

(Continued)

*Primary Examiner* — James O Hansen
(74) *Attorney, Agent, or Firm* — Best & Flanagan LLP (57) ABSTRACT

A slide rail mechanism is configured to be mounted to a first post and a second post of a rack. A transverse space is defined between the first post and the second post. The slide rail mechanism includes a first slide rail kit and a second slide rail kit. Each of the slide rail kits includes a fixed rail and a movable rail longitudinally movable relative to the fixed rail. The two fixed rails are respectively connected to the two posts, and are located outside the transverse space. Each of the fixed rails is formed with a passage corresponding to inside of the transverse space. Each of the movable rail is configured to be movably mounted to the passage.

6 Claims, 10 Drawing Sheets

(56) References Cited

U.S. PATENT DOCUMENTS

| | | |
|---|---|---|
| 2011/0279956 A1 | 11/2011 | Sun |
| 2012/0024803 A1* | 2/2012 | Replogle .................. H04Q 1/09 29/401.1 |
| 2012/0128278 A1 | 5/2012 | Chen et al. |
| 2013/0161468 A1 | 6/2013 | Chen et al. |

* cited by examiner

SLIDE RAIL MECHANISM AND SLIDE RAIL KIT THEREOF

CROSS REFERENCE TO RELATED APPLICATIONS

This is a divisional application of U.S. application Ser. No. 17/335,313, filed on Jun. 1, 2021.

BACKGROUND OF THE INVENTION

1. Field of the Invention

The present invention relates to a slide rail structure, and more particularly, to a slide rail mechanism applicable to a two-post rack and a slide rail kit thereof.

2. Description of the Prior Art

Figure 1:
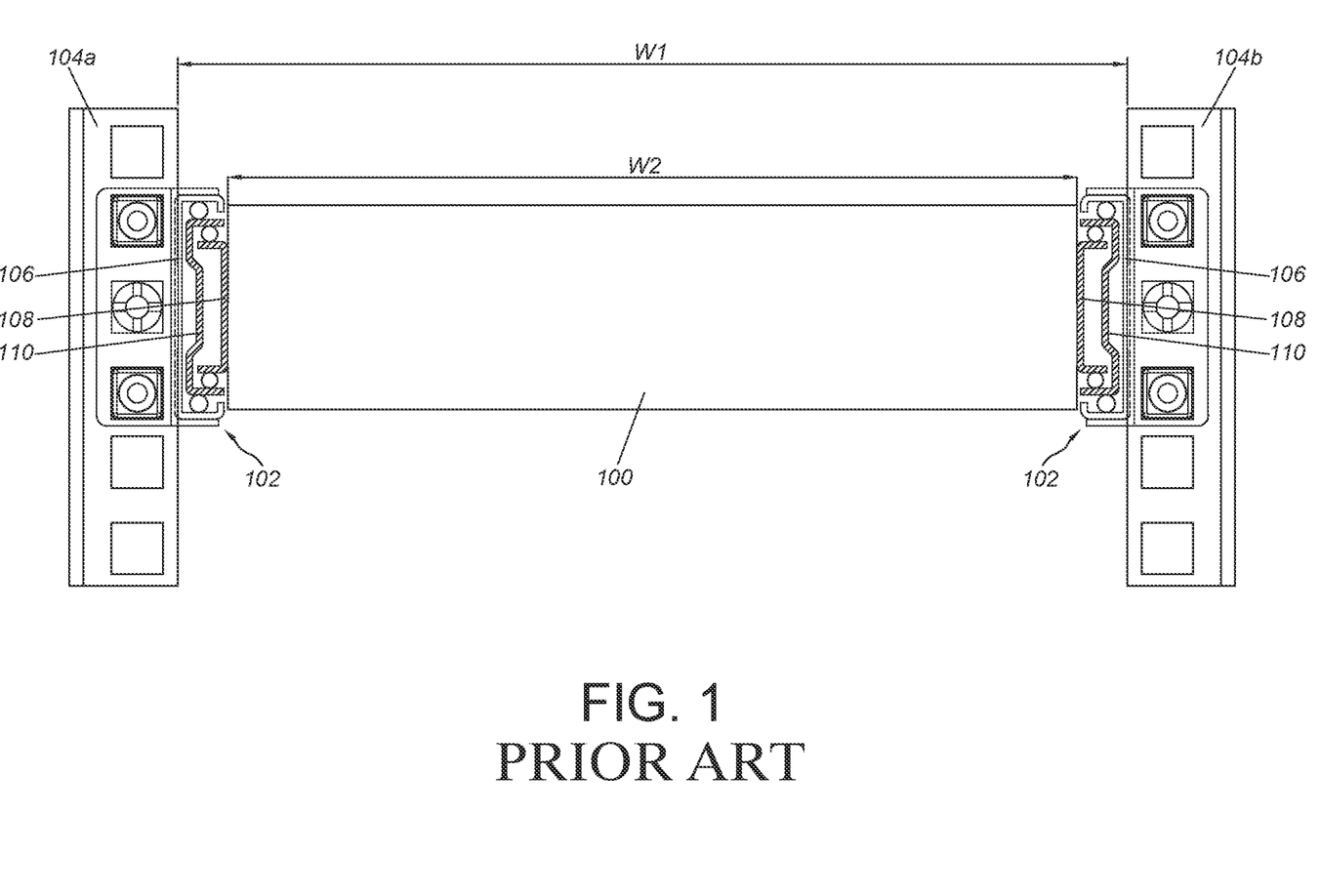
FIG. 1 is a diagram showing a carried object being mounted to a rack through a pair of slide rail assemblies in the prior art.

As shown in FIG. 1, in a rack system, two sides of a carried object 100 are mounted to a first post 104a and a second post 104b through a pair of slide rail assemblies 102. Each of the slide rail assemblies 102 usually comprises a first rail 106, a second rail 108 and a third rail 110 movably mounted between the first rail 106 and the second rail 108. Furthermore, a standardized width W1 of a predetermined space is usually defined between the first post 104a and the second post 104b. Therefore, a total width of the carried object 100 and the pair of slide rail assemblies 102 is required to correspond to the standardized width W1 of the predetermined space, so as to mount the carried object 100 between the first post 104a and the second post 104b. In other words, if a width W2 of the carried object 100 needs to be increased due to requirements, widths of the rails of the pair of slide rail assemblies 102 occupying the predetermined space must be smaller, such as reducing the number of slide rails of the pair of slide rail assemblies 102 occupying the predetermined space W1, so that a wider carried object can be smoothly mounted between the first post 104a and the second post 104b.

Therefore, it is important to develop various slide rail products for different market requirements.

SUMMARY OF THE INVENTION

The present invention provides a slide rail mechanism configured applicable to a two-post rack and a slide rail kit thereof.

According to an embodiment of the present invention, a slide rail mechanism is configured to be mounted to a two-post rack. The two-post rack comprises a first post and a second post. A transverse space is defined between the first post and the second post. The slide rail mechanism comprises a first slide rail kit and a second slide rail kit. The first slide rail kit is configured to be mounted to the first post, and the first slide rail kit comprises a first fixed rail and a first movable rail longitudinally movable relative to the first fixed rail. The second slide rail kit is configured to be mounted to the second post, and the second slide rail kit comprises a second fixed rail and a second movable rail longitudinally movable relative to the second fixed rail. The first fixed rail of the first slide rail kit is connected to the first post and located outside the transverse space. The second fixed rail of the second slide rail kit is connected to the second post and located outside the transverse space. Each of the first fixed rail and the second fixed rail is formed with a passage, and the passage corresponds to inside of the transverse space. The first movable rail is configured to be movably mounted to the passage of the first fixed rail, and the second movable rail is configured to be movably mounted to the passage of the second fixed rail.

Preferably, the first movable rail and the second movable rail are configured to be connected to a first side and a second side of a carried object respectively, and a transverse width defined by the carried object, the first movable rail and the second movable rail is substantially smaller than a space width of the transverse space.

Preferably, each of the first post and the second post comprises a first post part and a second post part opposite to the first post part; the first slide rail kit and the second slide rail kit further comprises a first base and a second base respectively; the first fixed rail is connected to the first post part of the first post through the first base, and the second fixed rail is connected to the first post part of the second post through the second base.

Preferably, the first base and the second base have substantially identical structural configuration, each of the first and second bases comprises a base part and a first connecting part substantially perpendicularly connected to the base part, and the first connecting part is configured to be connected to the first post part.

Preferably, the first fixed rail of the first slide rail kit is arranged on the base part of the first base, and the second fixed rail of the second slide rail kit is arranged on the base part of the second base.

Preferably, each of the first and second fixed rails comprises a first wall, a first supporting section, a second supporting section, a second wall, a third supporting section, a fourth supporting section and a longitudinal wall, the longitudinal wall is connected between the first wall and the second wall. The first supporting section and the second supporting section are arranged on the first wall, and the third supporting section and the fourth supporting section are arranged on the second wall; the passage is defined by a portion of the first wall, the first supporting section, the second supporting section, a portion of the second wall, the third supporting section and the fourth supporting section.

Preferably, the first movable rail and the second movable rail have substantially identical structural configuration. Each of the first and second movable rails comprises a first part, a second part and a longitudinal part connected between the first part and the second part; the portion of the first wall, the first supporting section and the second supporting section of each of the first and second fixed rails are configured to support the first part of the corresponding movable rail; the portion of the second wall, the third supporting section and the fourth supporting section of each of the first and second fixed rails are configured to support the second part of the corresponding movable rail.

Preferably, the first supporting section and the second supporting section are substantially perpendicularly connected to the first wall; the third supporting section and the fourth supporting section are substantially perpendicularly connected to the second wall.

Preferably, each of the first and second bases further comprises an extension part substantially perpendicularly connected to the first connecting part, and the base part and the extension part are extended relative to the first connecting part respectively in a first predetermined direction and a second predetermined direction opposite to the first predetermined direction.

Preferably, the extension part of each of the first and second bases comprises a first supporting part, and the first supporting part is configured to support the first part of the corresponding movable rail.

Preferably, the slide rail mechanism further comprises fitting members respectively connected to the extension parts of the first and second bases. The fitting member comprises a second supporting part, and the second supporting part is configured to support the second part of the corresponding movable rail.

Preferably, the fitting member further comprises a second connecting part configured to be connected to the second post part.

Preferably, the extension part of each of the first and second bases is further arranged with an auxiliary member configured to support at least one of the first part, the second part and the longitudinal part of the corresponding movable rail.

According to another embodiment of the present invention, a slide rail kit comprises a base, a fixed rail and a movable rail. The base comprises a base part and a connecting part substantially perpendicularly connected to the base part, and the connecting part is configured to connect the base to an object. The fixed rail is arranged on the base part of the base and formed with a passage. The movable rail is configured to be movably mounted to the passage of the fixed rail. The fixed rail comprises a first wall, a first supporting section, a second supporting section, a second wall, a third supporting section, a fourth supporting section and a longitudinal wall, the longitudinal wall is connected between the first wall and the second wall. The first supporting section and the second supporting section are arranged on the first wall, and the third supporting section and the fourth supporting section are arranged on the second wall. The passage is defined by a portion of the first wall, the first supporting section, the second supporting section, a portion of the second wall, the third supporting section and the fourth supporting section.

Preferably, the movable rail comprises a first part, a second part and a longitudinal part connected between the first part and the second part; the portion of the first wall, the first supporting section and the second supporting section of the fixed rail are configured to support the first part of the movable rail; the portion of the second wall, the third supporting section and the fourth supporting section of the fixed rail are configured to support the second part of the movable rail.

Preferably, the first supporting section and the second supporting section are substantially perpendicularly connected to the first wall, and the third supporting section and the fourth supporting section are substantially perpendicularly connected to the second wall.

Preferably, the base further comprises an extension part substantially perpendicularly connected to the connecting part, and the base part and the extension part are extended relative to the connecting part respectively in a first predetermined direction and a second predetermined direction opposite to the first predetermined direction.

Preferably, the extension part of the base comprises a first supporting part, and the first supporting part is configured to support the first part of the movable rail. A fitting member is connected to the extension part of the base. The fitting member comprises a second supporting part, and the second supporting part is configured to support the second part of the movable rail.

Preferably, the extension part of the base is further arranged with an auxiliary member configured to support at least one of the first part, the second part and the longitudinal part of the movable rail.

Preferably, the slide rail kit further comprises a first blocking feature arranged on one of the fixed rail and the movable rail, and a second blocking feature arranged on the other one of the fixed rail and the movable rail; when the movable rail is moved relative to the fixed rail from a retracted position to an extended position along an opening direction, the first blocking feature and the second blocking feature are configured to block each other, in order to prevent the movable rail from being moved from the extended position along the opening direction.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
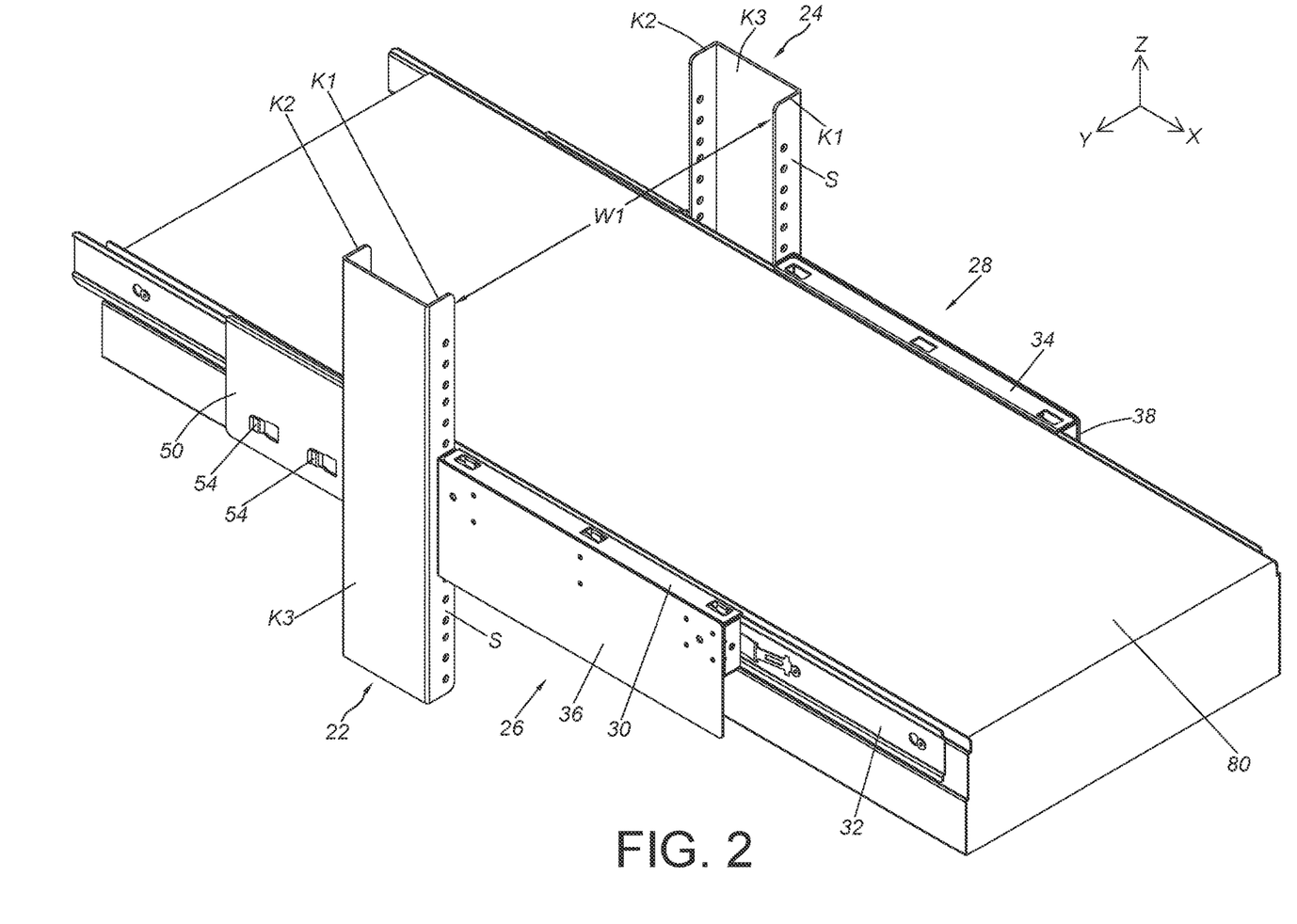
FIG. 2 is a diagram showing a carried object being mounted to a rack through a pair of slide rail kits according to an embodiment of the present invention.

As shown in FIG. 2, a slide rail mechanism is configured to be mounted to a two-post rack according to an embodiment of the present invention. The two-post rack comprises a first post 22 and a second post 24. The first post 22 and the second post 24 have substantially identical structural configuration and are symmetrical to each other. Furthermore, each of the first post 22 and the second post 24 comprises a first post part K1 and a second post part K2 located opposite to the first post part K1. Preferably, each of the first post 22 and the second post 24 further comprises a third post part K3 arranged between the first post part K1 and the second post part K2, and the first post part K1 and the second post part K2 are substantially perpendicularly connected to two ends (such as a front end and a rear end) of the third post part K3. A transverse space is defined between the first post 22 and the second post 24. For example, a space width W1 of the transverse space is defined between one edge of the first post part K1 of the first post 22 and one edge of the first post part K1 of the second post 24. (Or, the space width W1 of the transverse space is defined between one edge of the second post part K2 of the first post 22 and one edge of the second post part K2 of the second post 24.)

The slide rail mechanism comprises a first slide rail kit 26 and a second slide rail kit 28. The first slide rail kit 26 and the second slide rail kit 28 have substantially identical structural configuration and are symmetrical to each other. Furthermore, the first slide rail kit 26 is configured to be mounted to the first post 22 (or an object), and the first slide rail kit 26 comprises a first fixed rail 30 and a first movable rail 32 longitudinally movable relative to the first fixed rail 30. Similarly, the second slide rail kit 28 is configured to be mounted to the second post 24, and the second slide rail kit 28 comprises a second fixed rail 34 and a second movable rail (not shown in FIG. 2 due to the viewing angle) longitudinally movable relative to the second fixed rail 34. Moreover, in the present embodiment, an X-axis direction is defined as a longitudinal direction (or a length direction or a moving direction of a slide rail), a Y-axis direction is defined as a transverse direction (or a lateral direction of the slide rail) and a Z-axis direction is defined as a vertical direction (or a height direction of the slide rail).

The first fixed rail 30 of the first slide rail kit 26 is connected to the first post 22, and the first fixed rail 30 is located outside the transverse space between the first post 22 and the second post 24. The second fixed rail 34 of the second slide rail kit 28 is connected to the second post 24, and the second fixed rail 34 is located outside the transverse space between the first post 22 and the second post 24. Preferably, the first slide rail kit 26 and the second slide rail kit 28 further comprise a first base 36 and a second base 38 respectively. The first base 36 and the second base 38 has substantially identical structural configuration and are symmetrical to each other. The first fixed rail 30 is connected to a surface S of the first post part K1 of the first post 22 through the first base 36, such that the first fixed rail 30 is located outside the transverse space. The second fixed rail 34 is connected to a surface S of the first post part K1 of the second post 24 through the second base 38, such that the second fixed rail 34 is located outside the transverse space.

Figure 3:
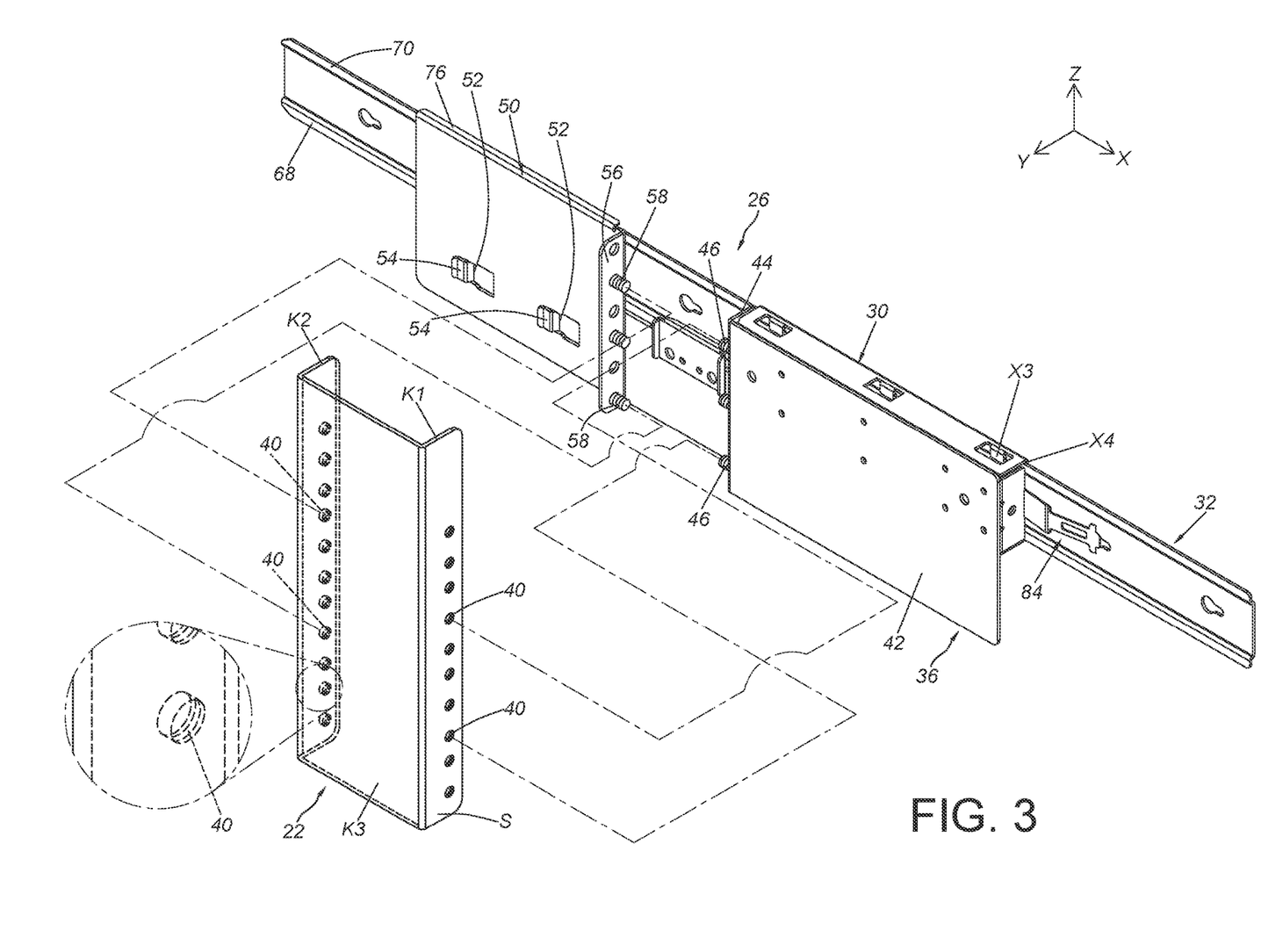
FIG. 3 is an exploded view of the slide rail kit and a post of the rack according to an embodiment of the present invention.
Figure 4:
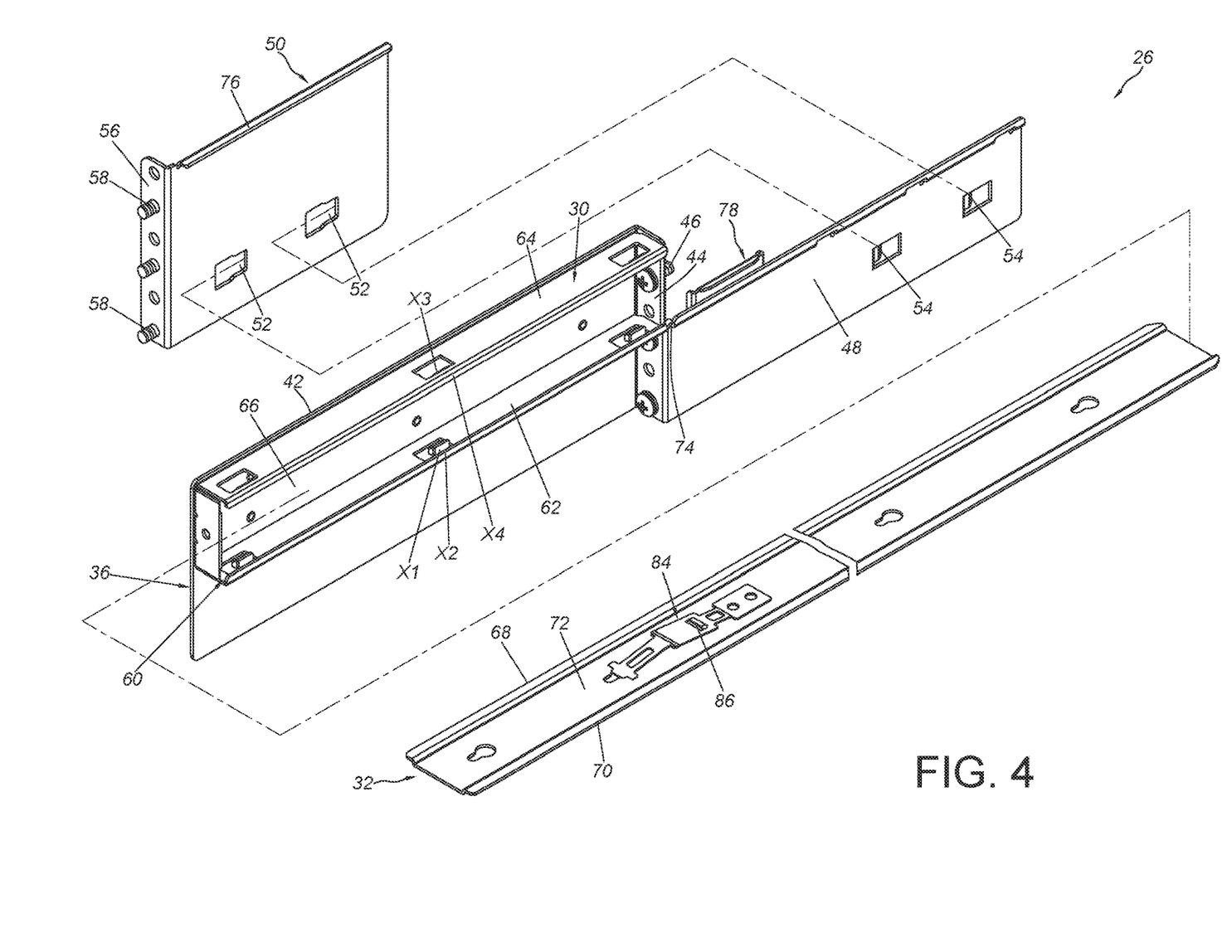
FIG. 4 is an exploded view of the slide rail kit according to an embodiment of the present invention.
Figure 5:
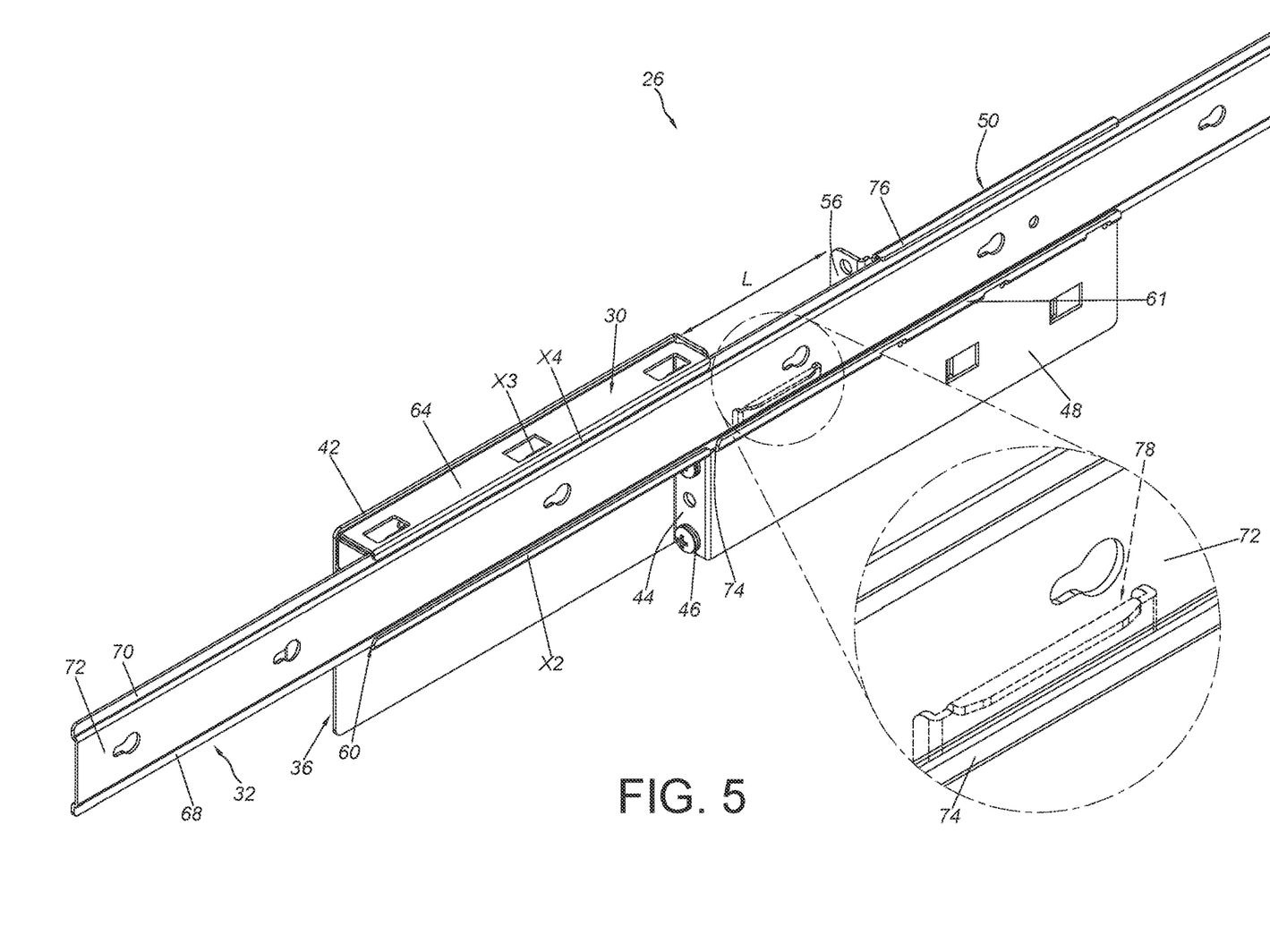
FIG. 5 is diagram showing the slide rail kit comprising an auxiliary member according to an embodiment of the present invention.

As shown in FIG. 3, FIG. 4 and FIG. 5, configuration of mounting the first slide rail kit 26 to the first post 22 is substantially identical to configuration of mounting the second slide rail kit 28 to the second post 24. Therefore, the configuration of mounting the first slide rail kit 26 to the first post 22 is illustrated in the figures.

Furthermore, the first post part K1 and the second post part K2 of the first post 22 have substantially identical structural configuration. Each of the first post part K1 and the second post part K2 of the first post 22 has a plurality of mounting features 40 (such as a plurality of screw holes, but the present invention is not limited thereto). The plurality of mounting features 40 are spaced apart from each other along a height direction of the first post 22. On the other hand, the first base 36 of the first slide rail kit 26 comprises a base part 42 and a first connecting part 44 substantially perpendicularly connected to the base part 42. The first connecting part 44 is configured to connect the first base 36 to the first post part K1 of the first post 22. For example, the first connecting part 44 is arranged with a plurality of first corresponding features 46 (such as a plurality of screws or bolts, but the present invention is not limited thereto), and the plurality of first corresponding features 46 are configured to be connected to the mounting features 40 of the first post part K1 of the first post 22.

Preferably, the first base 36 of the first slide rail kit 26 further comprises an extension part 48 substantially perpendicularly connected to the first connecting part 44 (as shown in FIG. 4). The base part 42 and the extension part 48 are extended relative to the first connecting part 44 respectively in a first predetermined direction and a second predetermined direction opposite to the first predetermined direction. The first predetermined direction and the second predetermined direction are, for example, a forward direction and a backward direction respectively, but the present invention is not limited thereto. According to such arrangement, the first base 36 can correspond to a longitudinal length of the first movable rail 32.

Preferably, the slide rail mechanism further comprises a fitting member 50 connected to the extension part 48 of the first base 36. In the present embodiment, the fitting member 50 and the extension part 48 are respectively provided with at least one first structure 52 and at least one second structure 54 detachably connected to each other. The first structure 52 can be connected to the second structure 54 by snapping or engaging. Or, the fitting member 50 can be connected (such as fixedly connected) to or integrated with the extension part 48. However, the present invention is not limited thereto. The fitting member 50 further comprises a second connecting part 56 configured to be connected to the second post part K2 of the first post 22. For example, the second connecting part 56 is arranged with a plurality of second corresponding features 58 (such as a plurality of screws or bolts, but the present invention is not limited thereto), and the plurality of second corresponding features 58 are configured to be connected to the mounting features 40 of the second post part K2 of the first post 22, such that the fitting member 50 is also located outside the transverse space between the first post 22 and the second post 24.

Preferably, the first fixed rail 30 of the first slide rail kit 26 is arranged on the base part 42 of the first base 36. (Similarly, the second fixed rail 34 of the second slide rail kit 28 is arranged on the base part of the second base 38 as shown in FIG. 2.)

Figure 6:
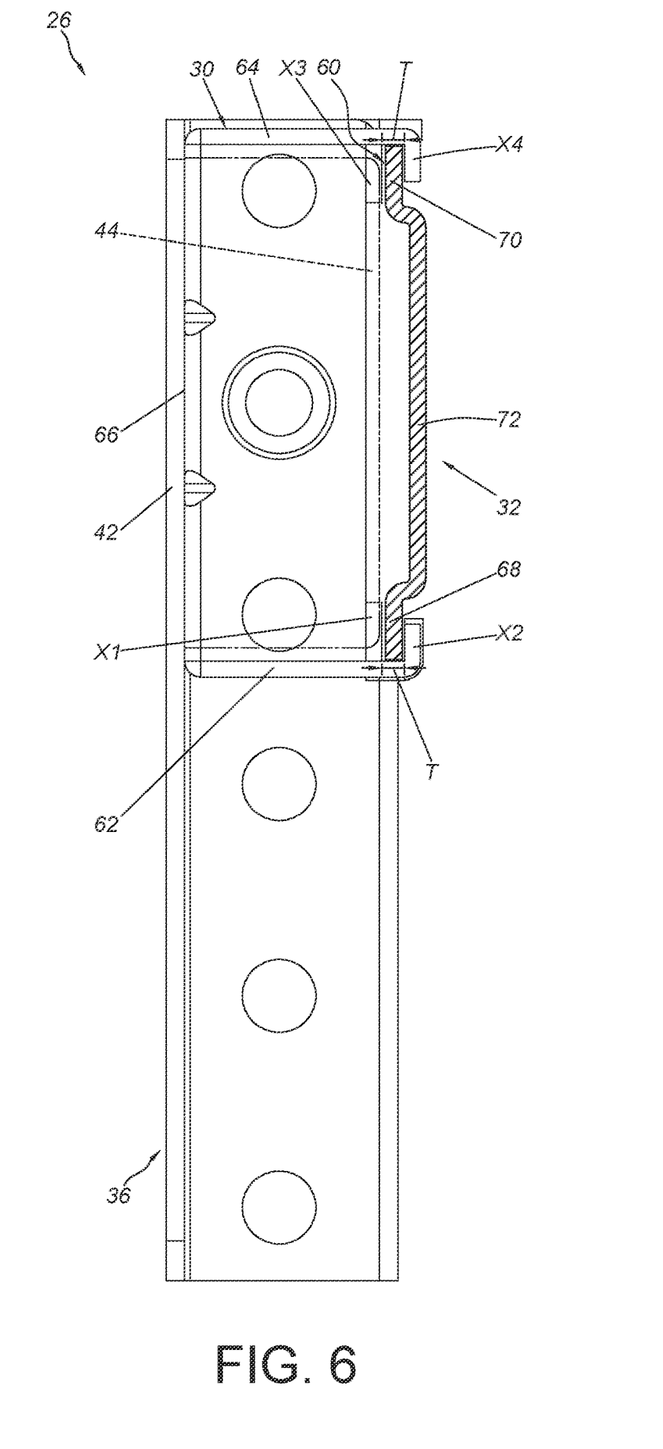
FIG. 6 is a cross-sectional view of the slide rail kit according to an embodiment of the present invention.

As shown in FIG. 4, FIG. 5 and FIG. 6, the first fixed rail 30 of the first slide rail kit 26 is formed with a passage 60. The first movable rail 32 of the first slide rail kit 26 is configured to be movably mounted to the passage 60 of the first fixed rail 30.

Preferably, the first fixed rail 30 of the first slide rail kit 26 comprises a first wall 62, a first supporting section X1, a second supporting section X2, a second wall 64, a third supporting section X3, a fourth supporting section X4 and a longitudinal wall 66. The longitudinal wall 66 is arranged at the base part 42 of the first base 36, and connected between the first wall 62 and the second wall 64. The first supporting section X1 and the second supporting section X2 is arranged on the first wall 62, and the third supporting section X3 and the fourth supporting section X4 are arranged on the second wall 64. The passage 60 is defined by a portion of the first wall 62, the first supporting section X1, the second supporting section X2, a portion of the second wall 64, the third supporting section X3 and the fourth supporting section X4, and configured to accommodate the first movable rail 32 of the first slide rail kit 26.

The first movable rail 32 comprises a first part 68, a second part 70 and a longitudinal part 72 connected between the first part 68 and the second part 70. The portion of the first wall 62, the first supporting section X1 and the second supporting section X2 of the first fixed rail 30 are configured to support the first part 68 of the first movable rail 32. The portion of the second wall 64, the third supporting section X3 and the fourth supporting section X4 of the first fixed rail 30 are configured to support the second part 70 of the first movable rail 32. According to such arrangement, the first fixed rail 30 is configured to support the first movable rail 32 in the height direction and the transverse direction, so as to enhance reliability and stability of the first movable rail 32 being mounted to the passage 60.

Preferably, the first supporting section X1 and the second supporting section X2 are substantially perpendicularly connected to the first wall 62; and the third supporting section X3 and the fourth supporting section X4 are substantially perpendicularly connected to the second wall 64.

Preferably, a passage width T is defined between the first supporting section X1 and the second supporting section X2; and the passage width T can also be defined between the third supporting section X3 and the fourth supporting section X4 (as shown in FIG. 6).

Preferably, the first supporting section X1 and the third supporting section X3 correspond to each other; the second supporting section X2 and the fourth supporting section X4 correspond to each other (as shown in FIG. 6).

Preferably, the extension part 48 of the first base 36 comprises a first supporting part 74 which is configured to support the first part 68 of the first movable rail 32; and the fitting member 50 comprises a second supporting part 76 which is configured to support the second part 70 of the first movable rail 32 (as shown in FIG. 4 and FIG. 5). An extension passage 61 is defined by the first supporting part 74 and the second supporting part 76, and correspondingly communicated with the passage 60.

Preferably, the extension part 48 of the first base 36 is further arranged with an auxiliary member 78 adjacent to the first supporting part 74 (as shown in FIG. 4 and FIG. 5). The auxiliary member 78 is at least configured to support a side of one of the first part 68 and the longitudinal part 72 of the first movable rail 32, so as to enhance the stability of the first movable rail 32 being mounted to the passage 60 of the first fixed rail 30. Moreover, a predetermined distance L is defined between the first connecting part 44 and the second connecting part 56 (the predetermined distance L is substantially slightly larger than a distance between the first post part K1 and the second post part K2 of the first post 22). When the first movable rail 32 is mounted to the passage 60 of the first fixed rail 30, a rail section of the first movable rail 32 corresponding to a range of the predetermined distance L is not supported by the first fixed rail 30. Therefore, through using the auxiliary member 78 to at least support a side of one of the first part 68 and the longitudinal part 72 of the first movable rail 32, structural strength or supporting strength of the first movable rail 32 can be enhanced.

Figure 7:
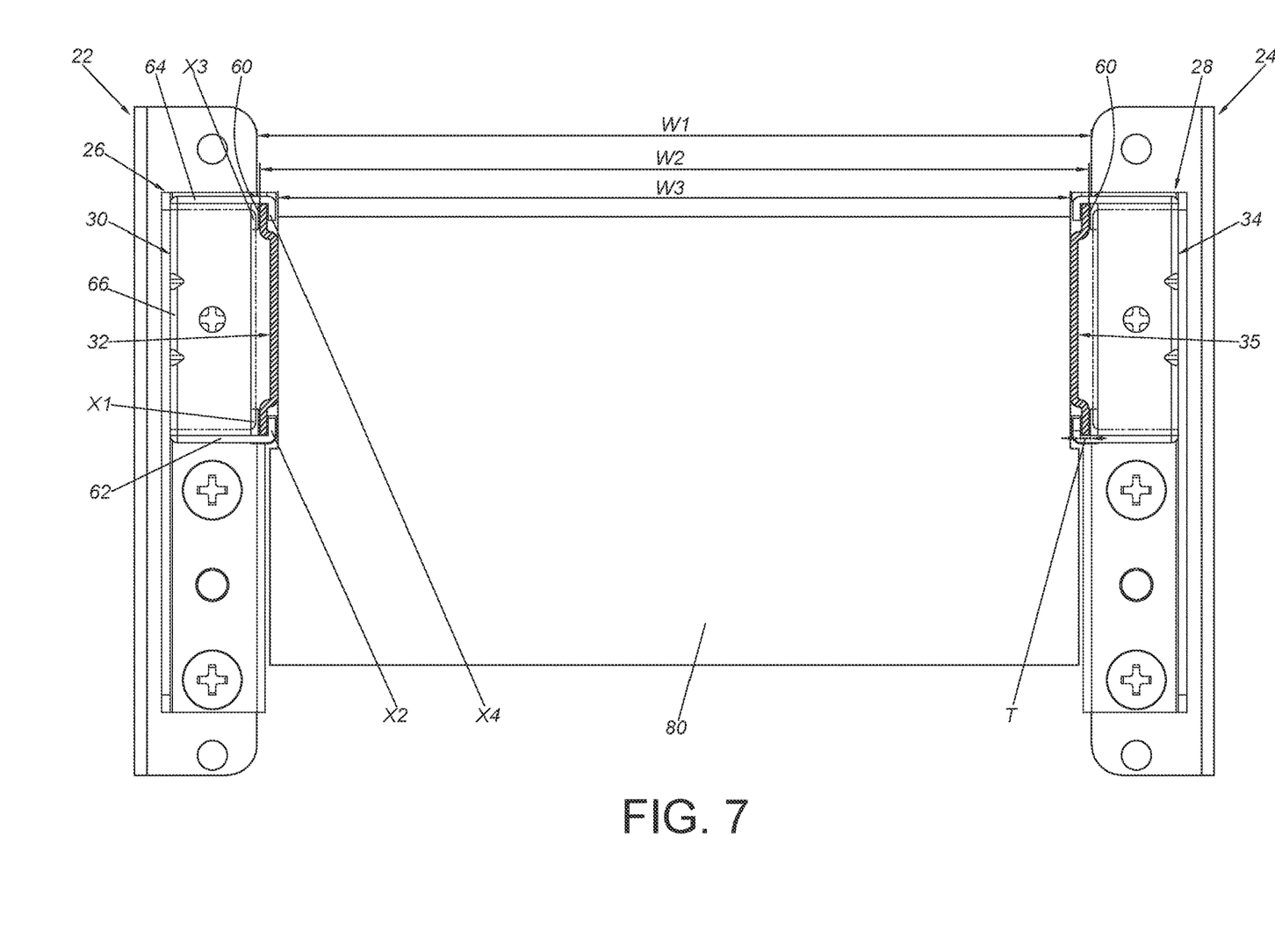
FIG. 7 is a diagram showing the carried object being mounted to the rack through the pair of slide rail kits according to an embodiment of the present invention.

As shown in FIG. 7, the first slide rail kit 26 is configured to be mounted to the first post 22, and the second slide rail kit 28 is configured to be mounted to the second post 24. The transverse space with the space width W1 is defined between the first post 22 and the second post 24. Each of the first fixed rail 30 and the second fixed rail 34 is provided with the passage 60. The passage 60 corresponds to inside of the transverse space (as shown in FIG. 6). The first movable rail 32 and the second movable rail 35 have substantially identical structural configuration. The first movable rail 32 is configured to be movably mounted to the passage 60 of the first fixed rail 30, and the second movable rail 35 is configured to be movably mounted to the passage 60 of the second fixed rail 34.

Preferably, the first movable rail 32 and the second movable rail 35 are configured to be respectively connected to a first side and a second side (opposite to the first side) of a carried object 80. A transverse width W2 is defined by the carried object 80, the first movable rail 32 and the second movable rail 35, and is substantially smaller than the space width W1 of the transverse space.

Accordingly, the first fixed rail 30 and the second fixed rail 34 are located outside the transverse space, such that the first fixed rail 30 and the second fixed rail 34 do not occupy the transverse space. Only the first movable rail 32 and the second movable rail 35 are configured to pass through the transverse space. In contrast to the prior art, the embodiment of the present invention can meet the requirement of a wider width W3 of the carried object 80.

Figure 8:
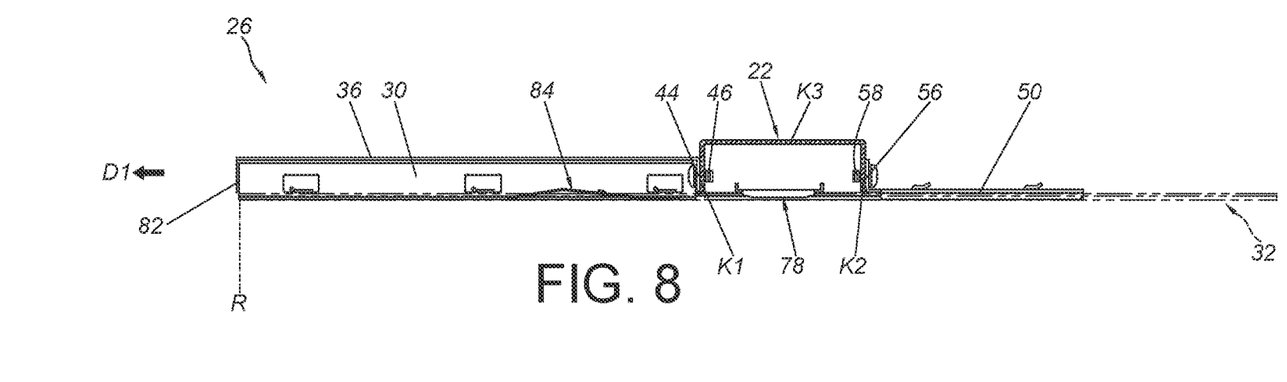
FIG. 8 is a diagram showing a movable rail of the slide rail kit being retracted relative to a fixed rail according to an embodiment of the present invention.
Figure 9:
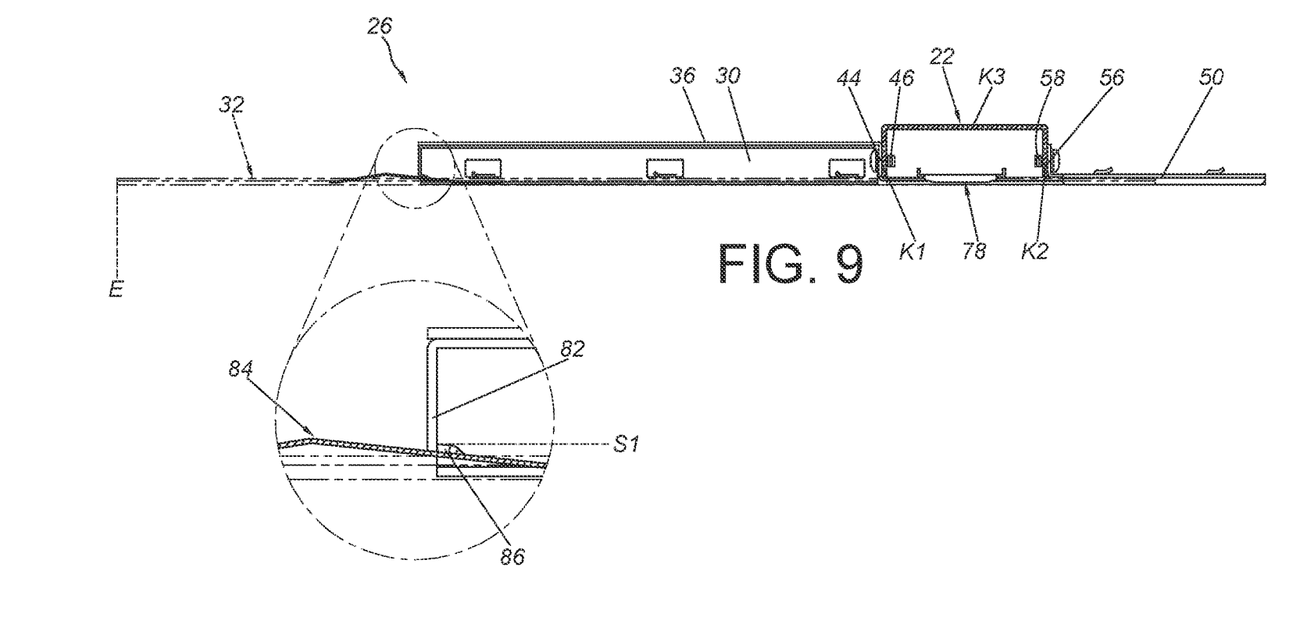
FIG. 9 is a diagram showing the movable rail being located at an extended position relative to the fixed rail, and a first blocking feature and a second blocking feature being configured to block each other according to an embodiment of the present invention.

As shown in FIG. 8 and FIG. 9, each of the slide rail kits 26, 28 (such as the first slide rail kit 26) further comprises a first blocking feature 82 arranged on one of the first fixed rail 30 and the first movable rail 32, and a second blocking feature 84 arranged on the other one of the first fixed rail 30 and the first movable rail 32. In the present embodiment, the first blocking feature 82 is arranged on the first fixed rail 30, and the second blocking feature 84 is arranged on the first movable rail 32. Preferably, the first blocking feature 82 is a blocking wall, and the second blocking feature 84 is an elastic member, but the present invention is not limited thereto.

When the first movable rail 32 is moved relative to the first fixed rail 30 from a retracted position R (as shown in FIG. 8) to an extended position E (as shown in FIG. 9) along an opening direction D1, a blocking part 86 of the second blocking feature 84 in a first state S1 is configured to block the first blocking feature 82, so as to prevent the first movable rail 32 from being further moved from the extended position E along the opening direction D1.

Figure 10:
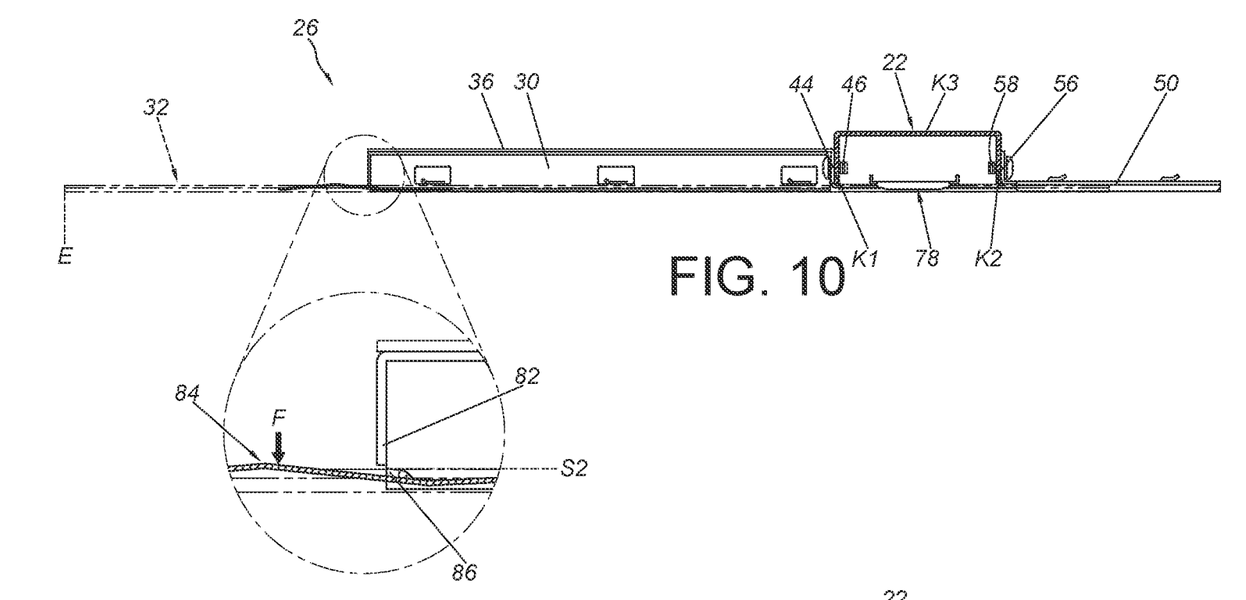
FIG. 10 is a diagram showing the movable rail being located at the extended position relative to the fixed rail, and the first blocking feature and the second blocking feature no longer blocking each other according to an embodiment of the present invention.
Figure 11:
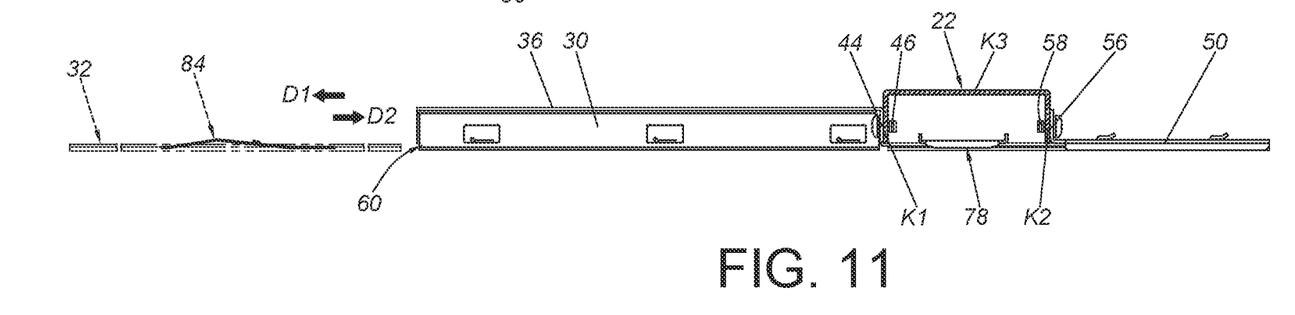
FIG. 11 is a diagram showing the movable rail being detached relative to the fixed rail according to an embodiment of the present invention.

As shown in FIG. 10 and FIG. 11, when the first movable rail 32 is located at the extended position E relative to the first fixed rail 30 (as shown in FIG. 10), a user can apply a force F to press the second blocking feature 84 to move the second blocking feature 84 to switch from the first state S2 to a second state S2, such that the blocking part 86 of the second blocking feature 84 no longer blocks the first blocking feature 82, so as to allow the first movable rail 32 to be further moved from the extended position E along the opening direction D1 to be detached from the passage 60 of the first fixed rail 30 (as shown in FIG. 11). Moreover, the first movable rail 32 can be inserted into the passage 60 of the first fixed rail 30 again along a retracting direction D2.

Figure 12:
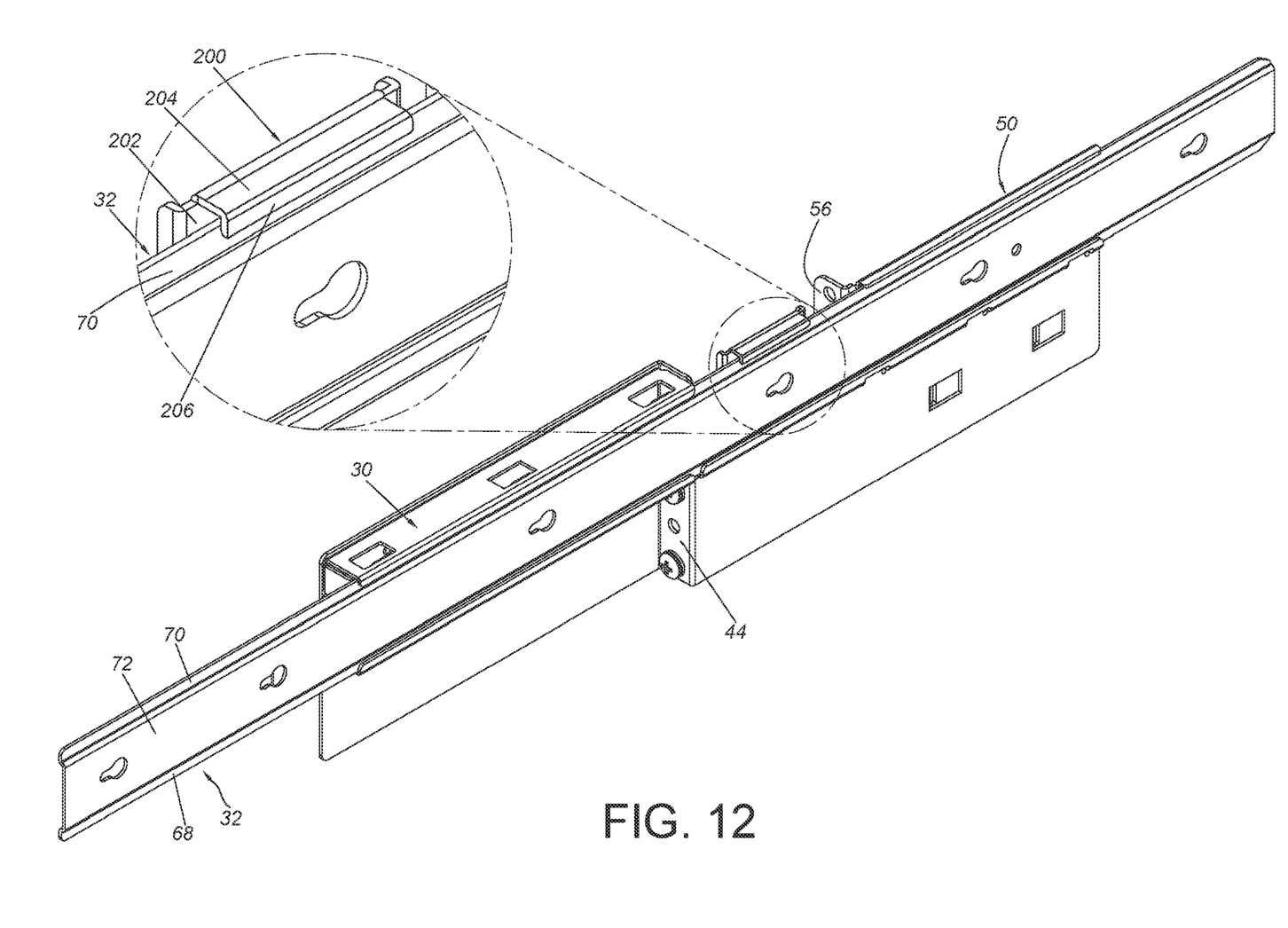
FIG. 12 is a diagram showing an auxiliary member of the slide rail kit according to another embodiment of the present invention.

FIG. 12 is a diagram showing another embodiment of the auxiliary member. Specifically, different from the auxiliary member 78 of the first embodiment, the auxiliary member 200 of the present embodiment is configured to at least support a side of the second part 70 of the first movable rail 32, such that the stability of the first movable rail 32 being mounted to the passage 60 of the first fixed rail 30 can also be enhanced. In the present embodiment, the auxiliary member 200 comprises a main body part 202, a first wall part 204 and a second wall part 206. The first wall part 204 is substantially perpendicularly bent relative to the main body part 202, and the second wall part 206 is substantially perpendicularly bent relative to the first wall part 204. A supporting space is defined by the main body part 202, the first wall part 204 and the second wall part 206 for allowing the second part 70 of the first movable rail 32 to pass through, such that the main body part 202, the first wall part 204 and the second wall part 206 are configured to support the second part 70 of the first movable rail 32.

Therefore, the slide rail mechanism and the slide rail kit thereof according to the embodiments of the present invention have the following technical features:

1. The first slide rail kit 26 and the second slide rail kit 28 of the slide rail mechanism are applicable to a two-post rack.
2. The first fixed rail 30 and the second fixed rail 34 are located outside the transverse space defined between the first post 22 and the second post 24, and only the first movable rail 32 and the second movable rail 35 are configured to pass through the transverse space. Therefore, in contrast to the prior art, the embodiments of the present invention can meet the requirement of the carried object 80 with a greater width W3.
3. The auxiliary member 78, 200 is configured to at least support one of the first part 68, the second part 70 and the longitudinal part 72 of the first movable rail 32, such that the stability of the first movable rail 32 being mounted to the passage 60 of the first fixed rail 30 can be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism configured to be mounted to a two-post rack, the two-post rack comprising a first post and a second post, a transverse space being defined between the first post and the second post, the slide rail mechanism comprising:
    a first slide rail kit configured to be mounted to the first post, and the first slide rail kit comprising a first fixed rail and a first movable rail longitudinally movable relative to the first fixed rail; and
    a second slide rail kit configured to be mounted to the second post, and the second slide rail kit comprising a second fixed rail and a second movable rail longitudinally movable relative to the second fixed rail;
    wherein the first fixed rail of the first slide rail kit is connected to the first post and located outside the transverse space;
    wherein the second fixed rail of the second slide rail kit is connected to the second post and located outside the transverse space;
    wherein each of the first fixed rail and the second fixed rail is formed with a passage, and the passage corresponds to inside of the transverse space;
    wherein the first movable rail is configured to be movably mounted to the passage of the first fixed rail, and the second movable rail is configured to be movably mounted to the passage of the second fixed rail;
    wherein each of the first post and the second post comprises a first post part and a second post part opposite to the first post part; the first slide rail kit and the second slide rail kit further comprises a first base and a second base respectively; the first fixed rail is connected to the first post part of the first post through the first base, and the second fixed rail is connected to the first post part of the second post through the second base;
    wherein the first base and the second base have substantially identical structural configuration, each of the first and second bases comprises a base part and a first connecting part substantially perpendicularly connected to the base part, and the first connecting part is configured to be connected to the first post part;
    wherein the first fixed rail of the first slide rail kit is arranged on the base part of the first base, and the second fixed rail of the second slide rail kit is arranged on the base part of the second base;
    wherein each of the first and second fixed rails comprises a first wall, a first supporting section, a second supporting section, a second wall, a third supporting section, a fourth supporting section and a longitudinal wall, the longitudinal wall is connected between the first wall and the second wall, the first supporting section and the second supporting section are arranged on the first wall, and the third supporting section and the fourth supporting section are arranged on the second wall; the passage is defined by a portion of the first wall, the first supporting section, the second supporting section, a portion of the second wall, the third supporting section and the fourth supporting section;
    wherein the first movable rail and the second movable rail have substantially identical structural configuration, each of the first and second movable rails comprises a first part, a second part and a longitudinal part connected between the first part and the second part; the portion of the first wall, the first supporting section and the second supporting section of each of the first and second fixed rails are configured to support the first part of the corresponding movable rail; the portion of the second wall, the third supporting section and the fourth supporting section of each of the first and second fixed rails are configured to support the second part of the corresponding movable rail;
    wherein each of the first and second bases further comprises an extension part substantially perpendicularly connected to the first connecting part, and the base part and the extension part are extended relative to the first connecting part respectively in a first predetermined direction and a second predetermined direction opposite to the first predetermined direction;
    wherein the extension part of each of the first and second bases comprises a first supporting part, and the first supporting part is configured to support the first part of the corresponding movable rail.

2. The slide rail mechanism of claim 1, wherein the first movable rail and the second movable rail are configured to be connected to a first side and a second side of a carried object respectively, and a transverse width defined by the carried object, the first movable rail and the second movable rail is substantially smaller than a space width of the transverse space.

3. The slide rail mechanism of claim 1, wherein the first supporting section and the second supporting section are substantially perpendicularly connected to the first wall; the third supporting section and the fourth supporting section are substantially perpendicularly connected to the second wall.

4. The slide rail mechanism of claim 1, further comprising fitting members respectively connected to the extension parts of the first and second bases, wherein the fitting member comprises a second supporting part, and the second supporting part is configured to support the second part of the corresponding movable rail.

5. The slide rail mechanism of claim 4, wherein the fitting member further comprises a second connecting part configured to be connected to the second post part.

6. The slide rail mechanism of claim 1, wherein the extension part of each of the first and second bases is further arranged with an auxiliary member configured to support at least one of the first part, the second part and the longitudinal part of the corresponding movable rail.

* * * * *